US006790698B2

(12) United States Patent
Miller et al.

(10) Patent No.: US 6,790,698 B2
(45) Date of Patent: *Sep. 14, 2004

(54) PROCESS FOR INTEGRATING DIELECTRIC OPTICAL COATINGS INTO MICRO-ELECTROMECHANICAL DEVICES

(75) Inventors: Michael F. Miller, Hollis, NH (US); Minh Van Le, Methuen, MA (US); Christopher C. Cook, Bedford, MA (US); Dale C. Flanders, Lexington, MA (US); Steven F. Nagle, Cambridge, MA (US)

(73) Assignee: Axsun Technologies, Inc., Billerica, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/954,861

(22) Filed: Sep. 18, 2001

(65) Prior Publication Data

US 2002/0048839 A1 Apr. 25, 2002

Related U.S. Application Data

(63) Continuation of application No. 09/907,856, filed on Jul. 18, 2001, now abandoned, which is a continuation-in-part of application No. 09/692,639, filed on Oct. 19, 2000, now Pat. No. 6,271,052.

(51) Int. Cl.[7] .............................................. H01L 21/00
(52) U.S. Cl. ...................................................... 438/50
(58) Field of Search ............................ 438/50, 52, 53, 438/125, 29, 42

(56) References Cited

U.S. PATENT DOCUMENTS

| 5,949,571 | A |   | 9/1999 | Goossen et al. ............ 359/291 |
| 5,959,516 | A | * | 9/1999 | Chang et al. .................. 334/14 |
| 5,963,788 | A |   | 10/1999 | Barron et al. ................. 438/48 |
| 6,174,820 | B1 |   | 1/2001 | Habermehl et al. ......... 438/745 |
| 6,178,284 | B1 |   | 1/2001 | Bergmann et al. .......... 385/140 |
| 6,271,052 | B1 | * | 8/2001 | Miller et al. .................. 438/50 |
| 6,351,577 | B1 | * | 2/2002 | Aksyuk et al. ............... 385/15 |
| 6,379,989 | B1 | * | 4/2002 | Kubby et al. ................. 438/52 |

FOREIGN PATENT DOCUMENTS

| EP | 0 689 078 A1 | 12/1995 | ........... G02B/26/08 |
| EP | 0 788 005 A2 | 8/1997 | ........... G02B/26/02 |
| WO | WO 9934484 | 7/1999 | |

OTHER PUBLICATIONS

Jerman, J.II., et al., "A Miniature Fabry–Perot Interferometer Fabricated Using Silicon Micromachining Techniques." XP–10079190A. pp. 16–18.

Aratani, K., et al., "Surface micromachined tuneable interferometer array. " XP–000454081. pp. 17–23.

Ayazi, Farrokh; Najafi, Khalil, "High Aspect–Ratio Combined Poly and Single–Crystal Silicon (HARPSS) MEMS Technology," Journal of Microelectromechanical Systems, vol. 9, No. 3 Sep. 3, 2000, pp. 288–294.

Dichroic Filter Array™ Patent Patterned Coatings Technology, Ocean Optics, Inc., http://www.oceanotics.com/products/dfa.asp.

* cited by examiner

Primary Examiner—David Nelms
Assistant Examiner—Quoc Hoang
(74) Attorney, Agent, or Firm—J. Grant Houston

(57) ABSTRACT

A process for patterning dielectric layers of the type typically found in optical coatings in the context of MEMS manufacturing is disclosed. A dielectric coating is deposited over a device layer, which has or will be released, and patterned using a mask layer. In one example, the coating is etched using the mask layer as a protection layer. In another example, a lift-off process is shown. The primary advantage of photolithographic patterning of the dielectric layers in optical MEMS devices is that higher levels of consistency can be achieved in fabrication, such as size, location, and residual material stress. Competing techniques such as shadow masking yield lower quality features and are difficult to align. Further, the minimum feature size that can be obtained with shadow masks is limited to ~100 μm, depending on the coating system geometry, and they require hard contact with the surface of the wafer, which can lead to damage and/or particulate contamination.

26 Claims, 11 Drawing Sheets

PROCESS FOR INTEGRATING DIELECTRIC OPTICAL COATINGS INTO MICRO-ELECTROMECHANICAL DEVICES

THIS APPLICATION IS A CON OF Ser. No. 09/907,856 Jul. 18, 2001 ABN WHICH IS A CIP OF Ser. No. 09/692,639 Oct. 19, 2000 U.S. PAT No. 6,271,052.

BACKGROUND OF THE INVENTION

Microelectromechanical system (MEMS) deflectable structures such as cantilevers and membranes are used in a number of different optical applications. For example, they can be coated to be reflective to highly reflective and then paired with a stationary mirror to form a tunable Fabry-Perot (FP) filter. They can also be used to define the end of a laser cavity. By deflecting the structure, the spectral location of the cavity modes can be controlled. They can also be used to produce movable lenses or movable dichroic filter material.

The MEMS structure is typically produced by etching features into a device layer to form the structure's pattern. An underlying sacrificial layer is subsequently etched away or otherwise removed to produce a suspended structure in a release process. Often the structural layer is a silicon or silicon compound and the sacrificial layer is silicon dioxide or polyimide. The silicon dioxide can be preferentially etched relative to silicon in hydrofluoric acid, for example.

Typically, deflection of the structure is achieved by applying a voltage between the structure and a fixed electrode. Electrostatic attraction deflects the membrane in the direction of the fixed electrode as a function of the applied voltage. This effect changes the reflector separation in the FP filter or cavity length in the case of a laser. Movement can also be provided by thermal or other actuation mechanism.

High reflectivity coatings (R>98%), coatings requiring some reflectivity and low loss, and/or coatings in which the reflectivity varies as a function of wavelength (e.g., dichroism) require thin film dielectric optical coatings. These coatings typically include alternating layers of high and low index material. The optics industry has developed techniques to produce these high performance coatings and has identified a family of materials with well-characterized optical and mechanical properties. Candidate materials include silicon dioxide, titanium dioxide and tantalum pentoxide, for example.

SUMMARY OF THE INVENTION

A challenge in the production of optical MEMS devices requiring dielectric optical coatings is to develop a device design and corresponding fabrication sequence that contemplates the integration of the MEMS release structure and the optical coatings.

The present invention concerns a process for patterning dielectric layers of the type typically found in optical coatings in the context of MEMS manufacturing. More specifically, a dielectric coating is deposited over a device layer, which has or will be released, and patterned using a mask layer. In one example, the coating is etched using the mask layer as a protection layer. In another example, a lift-off process is used.

The primary advantage of photolithographic patterning of the dielectric layers in optical MEMS devices is that higher levels of consistency can be achieved in fabrication, such as size, location, and residual material stress. Competing techniques such as shadow masking yield lower quality features and are difficult to align. Further, the minimum feature size that can be obtained with shadow masks is limited to ~100 μm, depending on the coating system geometry, and they can require hard contact with the surface of the wafer, which can lead to damage and/or particulate contamination.

Further advantages of the proposed patterning sequence are that the coating can be applied conformally over the surface of the wafer. The deposition systems used for optical coatings generally do not conform to the same standards of cleanliness as semiconductor processing tools. Applying a conformal coating to the surface of a plain wafer allows the material to undergo standard clean processes (RCA, piranha, etc.) prior to being processed in other tools. Thus, the risk of contamination can be managed effectively. These cleaning steps can be repeated after the etching of the dielectric film to form the patterned features.

In some instances, the dielectric coating may not be able to survive exposure to the etchants used to remove the sacrificial layer during the release process. In such cases, according to the invention, the dielectric layer is encapsulated by a protection layer or deposited on the released or partially released device layer.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

FIGS. 1A through 1G illustrate a process for fabricating a MEMS deflectable structure, such as a membrane, with an optical coating, which utilizes principles of the present invention.

Figure 1A:
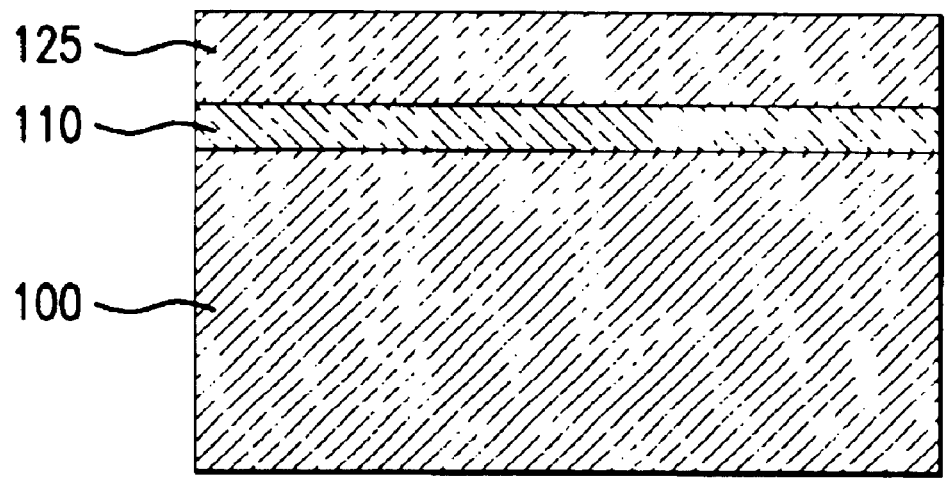
FIGS. 1A through 1G are schematic cross-sectional views illustrating one embodiment of a MEMS membrane fabrication sequence according to the present invention.

Referring to FIG. 1A, the process begins with a support such as a handle wafer 100, which in one embodiment is a standard n-type doped silicon wafer. The handle wafer 100 is 75 mm to 150 mm in diameter and is 400 to 500 microns thick in one implementation.

A sacrificial layer 110 is formed on the wafer 100 through oxidization, for example. This sacrificial layer 110 has a depth of typically less than 10 micrometers ($\mu$m), 2 to 5 $\mu$m in one example. The device layer 125 is deposited or installed on the sacrificial layer 110.

Presently, the device layer 125 is typically greater than 5 $\mu$m. Currently, it is between 6 to 10 $\mu$m in thickness. In one implementation, the device layer is a polysilicon layer that is deposited in a low-pressure chemical vapor deposition process. A dopant, such as n-type, is preferably added to improve conductivity while controlling the crystallinity and density of the polysilicon. In an alternative process, silicon wafer material is used as the device layer. In a wafer bonding process, a silicon device layer 125 is bonded to the oxide layer 110 using elevated temperature and pressure.

After deposition or bonding, the device layer 125 is annealed and polished back to the desired membrane thickness, if required.

Figure 1B:
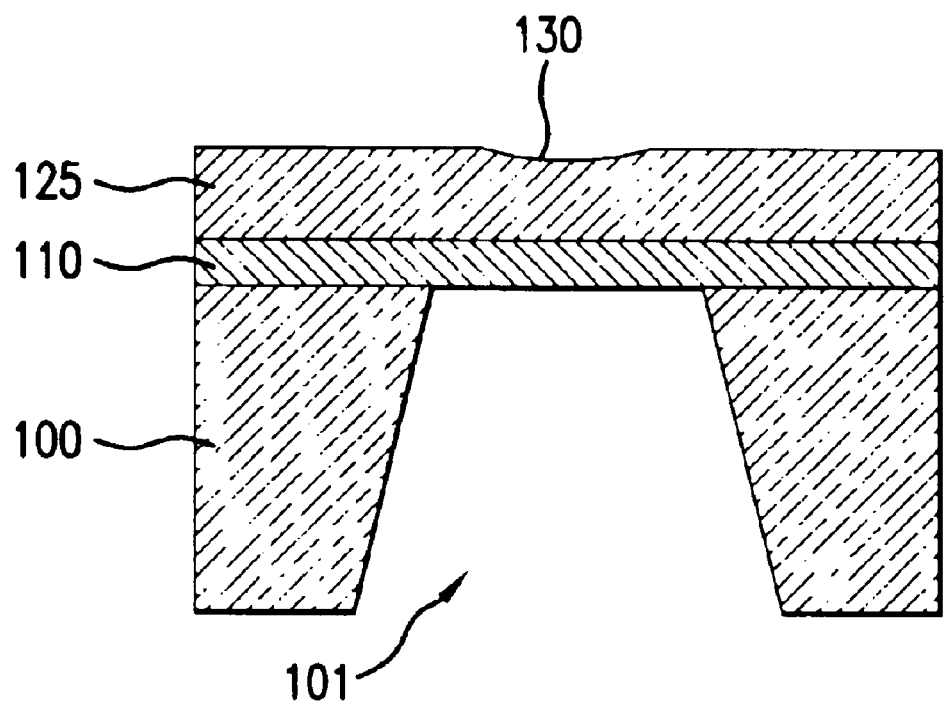

As shown in FIG. 1B, an optical port 101 is patterned and etched into the backside of the handle or support wafer 100, preferably using a combination of isotropic and anisotropic etching. The sacrificial oxide layer 110 is used as an etch stop. Alternatively, the optical port etch step can be omitted, as silicon is partially transparent at infrared wavelengths, in which case an anti-reflective (AR) coating is applied to the outer surface of handle wafer 100 to minimize reflection from the air-silicon interface.

According to one of the current embodiments, a depression 130 is formed in the front side of the device layer 125. This depression is used to form a curved mirror structure.

Figure 1C:
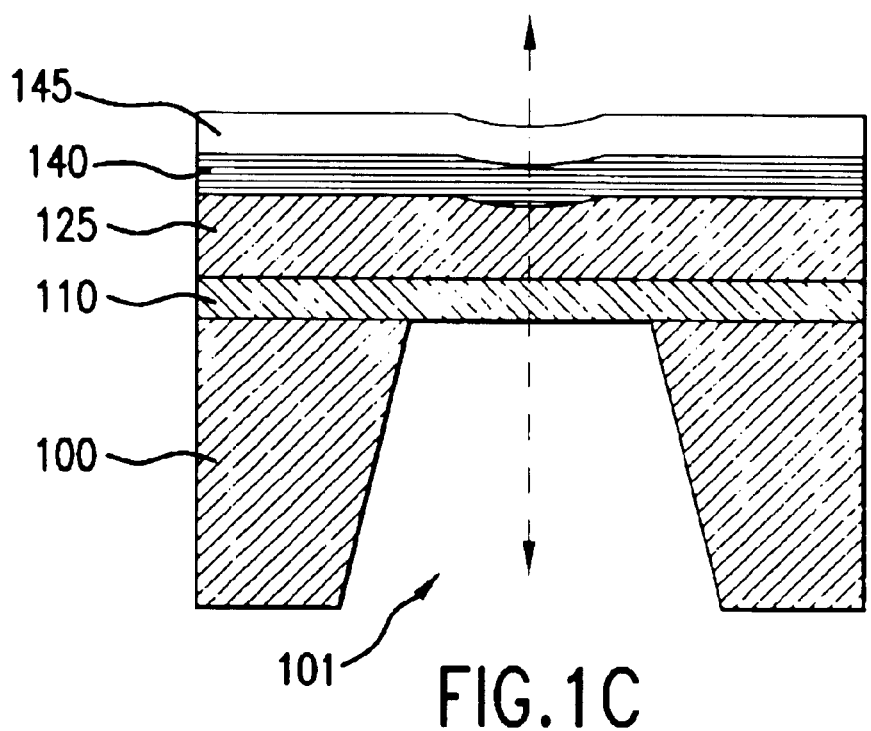

FIG. 1C shows the deposition of a multi layer, thin film dielectric coating 140. In one example, the coating is highly reflective (HR), i.e., has a reflectivity of greater than 98%. In another example, the coating has a lower reflectivity of 30% to 98% for example. The dielectric coating is chosen, however, over gold, aluminum, or other metals, for example because of its low loss characteristics. In still other embodiments, the dielectric coating functions as a dichroic filter, such as a WDM filter, that selectively transmits and reflects specific wavelength bands.

In the current example, the dielectric coating 140 is an HR coating having preferably 4 or more quarterwave layers, preferably 8 or more, with a 16 dielectric layer mirror being used in some implementations.

A mask layer 145 is deposited over the dielectric coating 140.

Figure 1D:
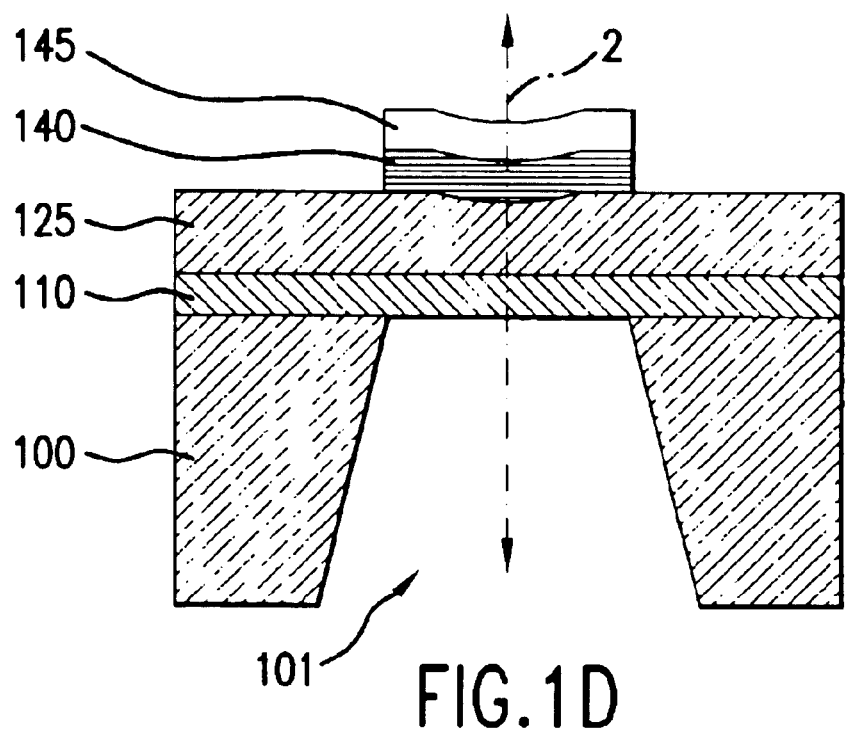

FIG. 1D shows the patterning of the mask layer 145. Preferably, a positive or negative photoresist is used, which is developed so that the remainder of the mask layer 145 resides in an optical port region that surrounds an optical axis 2 of the device. This is located over the optical port 101, if present. The remainder of the mask layer 145 is used as an etch protection layer during a subsequent etch of the dielectric coating 140, thus yielding the patterned dielectric coating 140 of the figure.

The preferred method for etching the dielectric coatings 140 is to use a dry etch process, such as reactive ion etching and reactive ion milling. Films with a thickness of 3 to 4 $\mu$m have been etched with a photoresist mask, provided adequate backside cooling is employed. The etch chemistry can be based on CHF3/CF4/Ar. Ion beam milling is an alternative, but the etch times for this process are typically much longer.

Figure 1E:
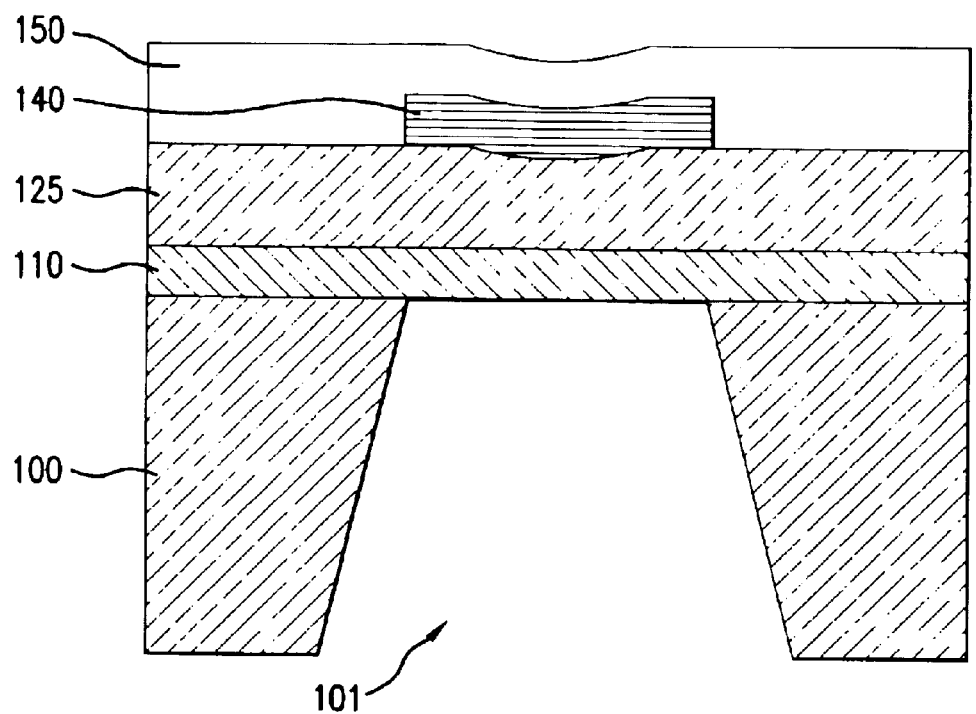

FIG. 1E shows the deposition of membrane mask/patterned dielectric protection layer 150, which is used in the patterning of the device layer 125.

Figure 1F:
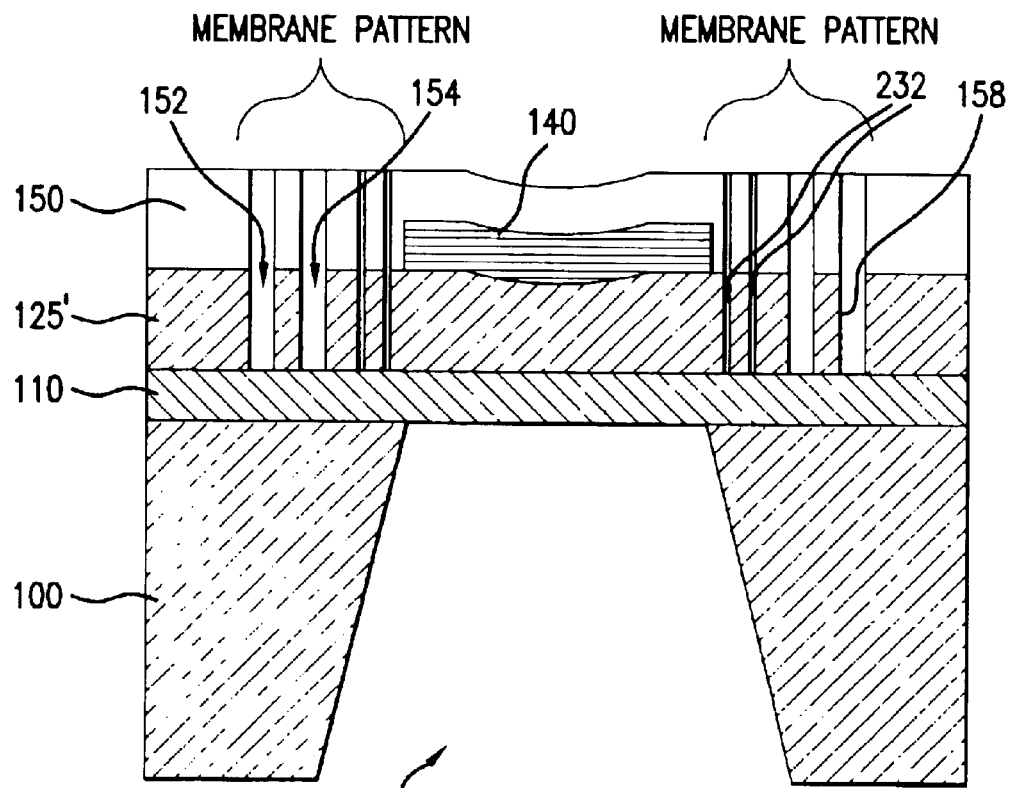

FIG. 1F shows development of the membrane mask/patterned dielectric protection layer 150 with the membrane and tether patterns. These patterns are transferred into the device layer 125. Voids 152 and 154 are formed in the device layer 125 to define the tethers 158 of the membrane, along with release holes 232. The membrane mask layer 125 functions to protect the dielectric coating 140 from the etchants used to attack the exposed regions of the device layer.

Figure 1G:
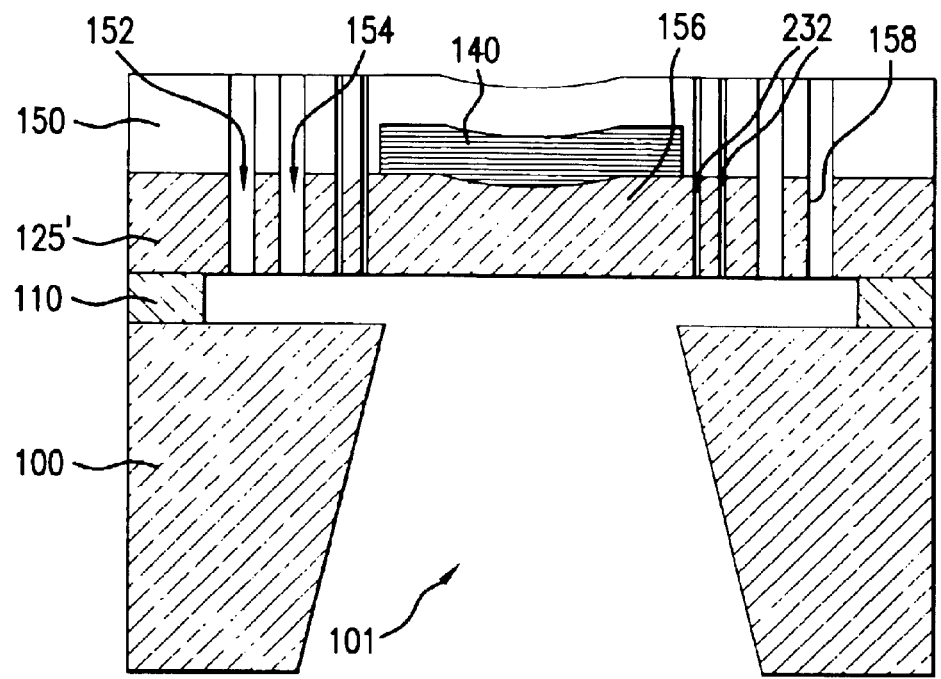

FIG. 1G shows the device after the release process. A portion of the sacrificial layer 110 is removed by a wet oxide etch process to "release" the membrane and tether structure from the sacrificial oxide layer 110 and handle wafer 100. In one embodiment, a buffered HF etch, followed by methanol, followed by a drying step using supercritical carbon dioxide is used. The etchant attacks the release layer from the backside through the optical port 101 and the front side through the voids 152, 154 and release holes 232.

Preferably, the dielectric coating 140 is entirely encapsulated between the protection layer 150 and the device layer 125. Protection of the dielectric coating 140 during release is required since materials such as silicon dioxide, titanium dioxide and tantalum pentoxide are etched by hydrofluoric acid. Preferably, a buffered etch is also used to preserve the protection layer 150, especially if a photoresist material is used.

Another protection scheme is to deposit a mask layer that functions as a protection mask as well as be incorporated into the overall optical function of the coating, eliminating the need to remove the mask layer after release. For example, two candidate materials are amorphous silicon or silicon nitride. In this process, the dielectric film is deposited conformally over the surface; but the coating design is adjusted in anticipation of an additional layer. The features are etched using the dry etch process as before. An additional conformal layer is then deposited over the entire surface of the wafer. Sputtering or a plasma enhanced chemical vapor deposition (PECVD) systems provide the best conformal coverage. However, an e-beam evaporator with a planetary system is an alternative. The optical design of the coating is tailored so that its performance was not sensitive to the thickness of this last layer, eliminating the need for precise control of the deposition rate. This final mask layer is patterned using a dry or wet etch process if it were desirable to reduce the area over which it extended. For example, it may be necessary to reduce the area to that immediately surrounding the dielectric coating so that it does not influence the mechanical properties of the MEMS structure.

Figure 2:
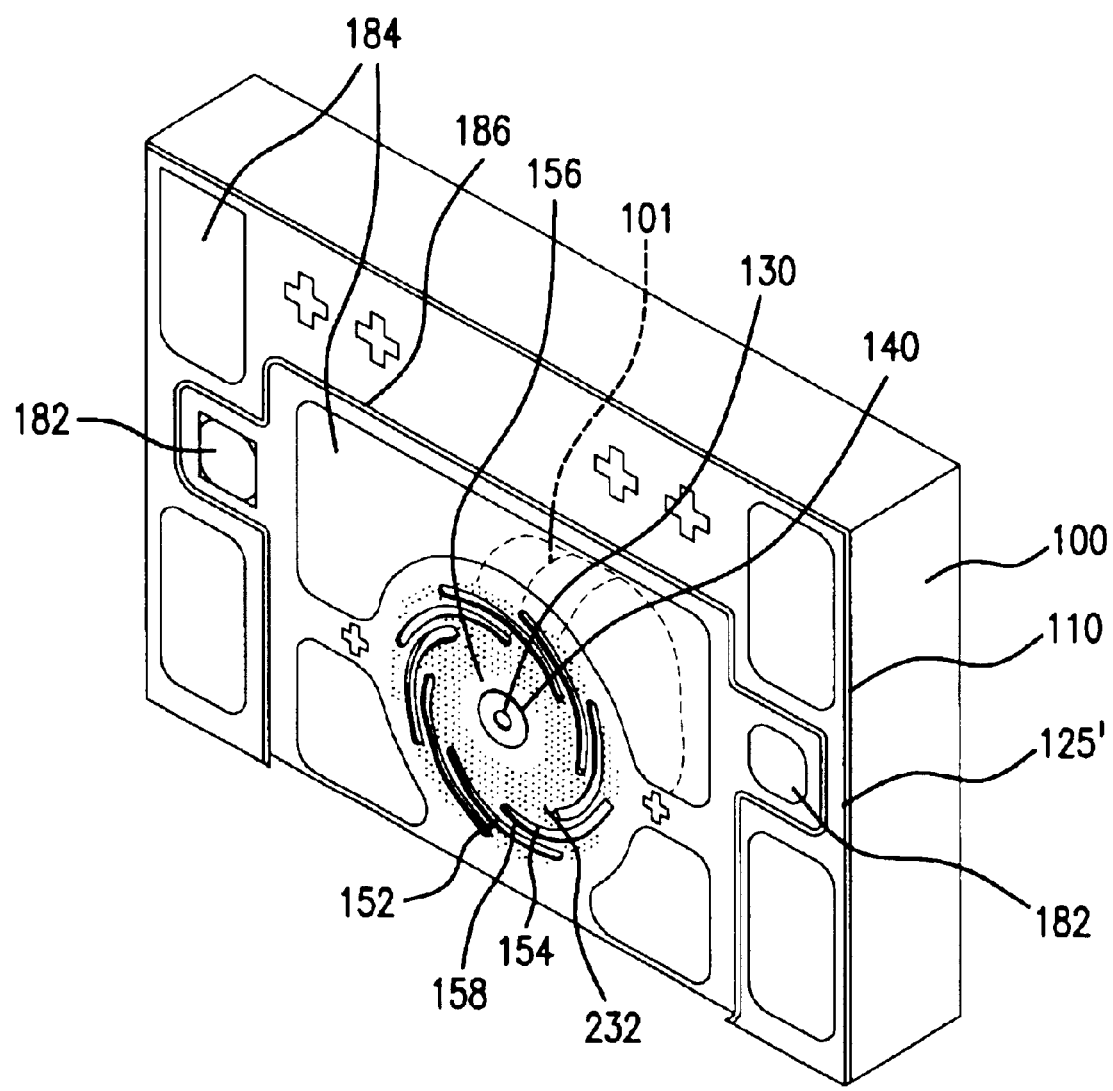
FIG. 2 is a perspective view of a singulated MEMS membrane device that has been fabricated according to the present invention.

FIG. 2 shows the completed MEMS device. An exemplary membrane-tether configuration is shown. The patterned membrane layer 125' comprises a center body portion 156 that is aligned over the optical port 101 (shown in phantom) and tethers 158 formed by the removal of the device layer from voids or regions 152, 154.

Also shown are metalizations for electrical connections to the device and handle layer (see reference 182) and for mechanical attachment (see reference 184). An isolation trench 186 through at least the device layer 125' prevents shorting of the handle and device layers due to edge damage.

Figure 3:
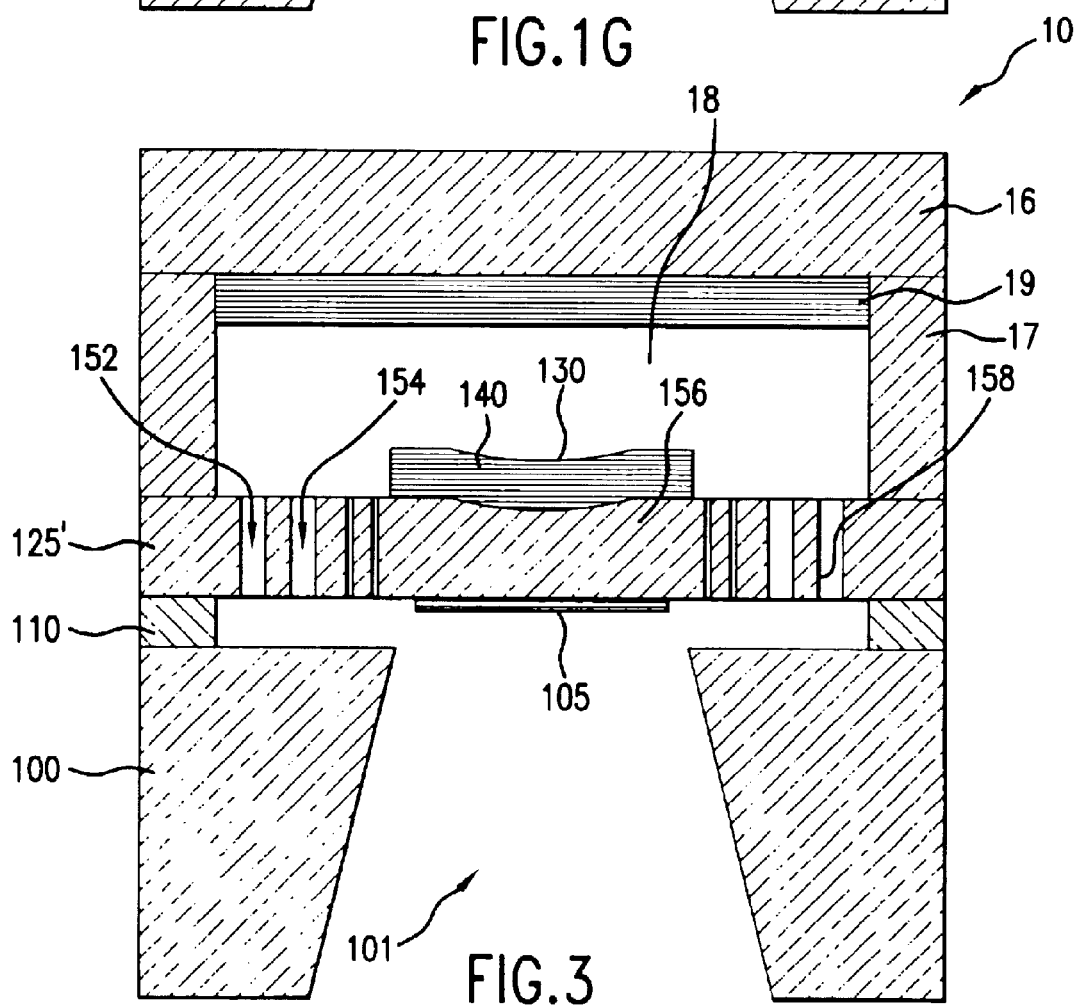
FIG. 3 is a schematic cross-sectional view illustrating use of the MEMS membrane in a Fabry-Perot tunable filter.

FIG. 3 shows the deployment of the MEMS device in Fabry-Perot filter 10. Specifically, it is paired with a mirror to form a FP cavity 18. Specifically, in addition to the MEMS membrane, the filter 10 includes mirror device 16 and a spacer layer 17 that separates the mirror device from the MEMS membrane. The mirror device 16 includes a dielectric mirror coating 19 that is preferably matched to the membrane's dielectric coating 140 in reflectivity. These functional layers are held together and operated as a tunable FP filter by modulating voltage between the handle wafer 100 and the membrane 125'. An anti-reflection (AR) coating 105 is preferably deposited through the optical port 101 onto the exterior surface of the membrane layer 125'.

In the illustrated embodiment, the curved mirror is located on the membrane. In other implementations, the curved surface is located on the mirror device. The advantage to the placement on the membrane concerns the ability to manufacture the mirror device integrated with the spacer using SOI material, for example. In still other implementations, both mirrors are flat to form a flat—flat cavity.

Figure 4A:
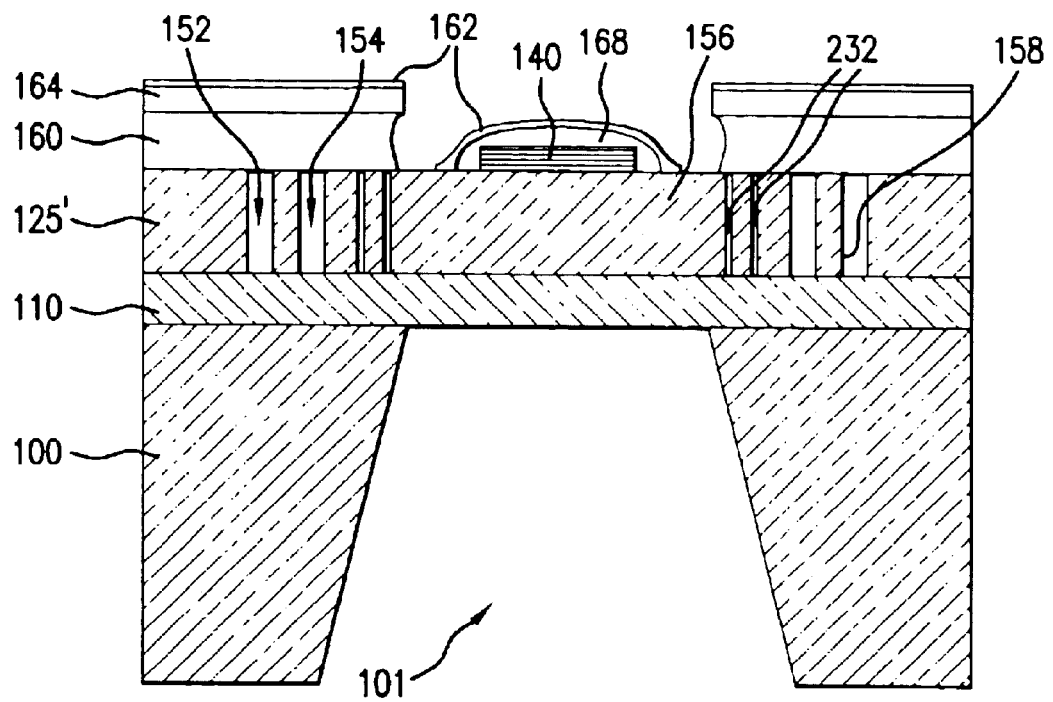
FIGS. 4A and 4B are schematic cross-sectional views illustrating another embodiment of a MEMS membrane fabrication sequence according to the present invention.
Figure 4B:
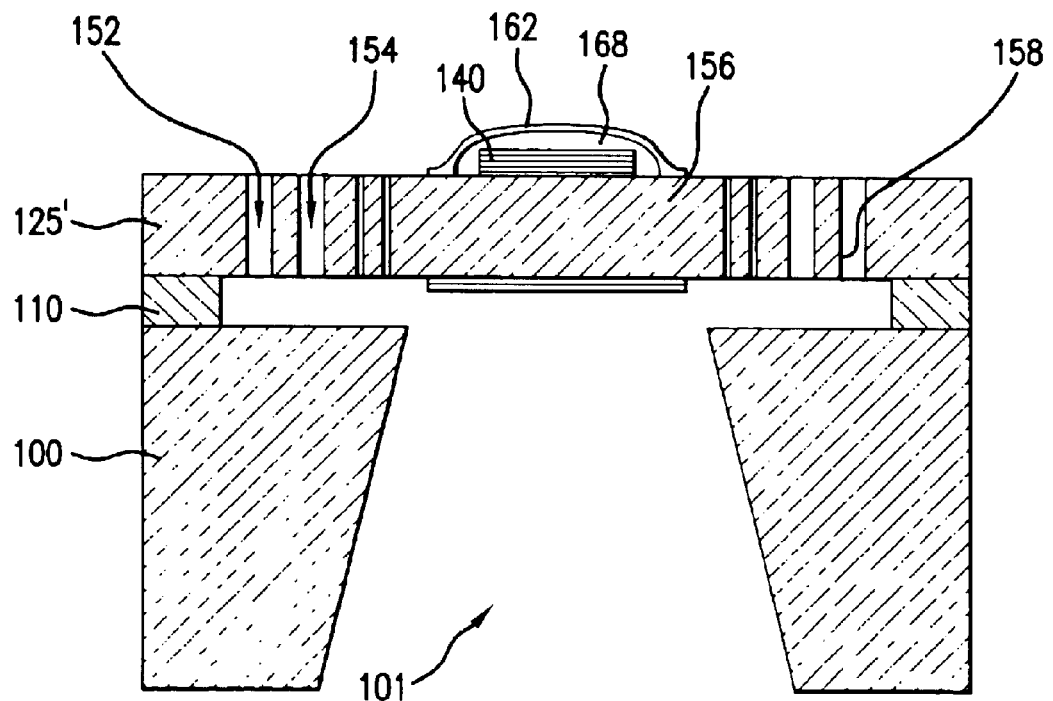

FIGS. 4A and 4B illustrate an alternative process for protecting the dielectric coating 140 during the release process, specifically after the membrane layer 125' has been patterned and the dielectric coating 140 has been patterned. This alternative process, in one example, begins with the device illustrated in FIG. 1F, with resist 150 stripped.

First, a resist smoothing layer 168 is deposited to cover and encapsulate the patterned dielectric coating 140. Then, a lift-off resist 160 and possibly a second resist 164 are deposited to cover the topography of the patterned membrane layer 125', the topography being for example, the etch holes 232 and voids 152, 154 defining the tethers 158.

With the lift-off resist 160 in place, a protection layer of material that is impervious to the release etchant is deposited. It completely covers the surface of the wafer or coupon, including the lift-off resist 160 and sensitive topography of the resist smoothing layer 168. In one implementation, this protection layer 162 is a metal, such as nickel or gold, for example.

To achieve good sidewall coverage, as required for a protection mask, a sputtering system is preferred. In some instances, the smoothing layer 168 may not be needed, depending on the profile of coating 140 and sputtering coverage.

Next, in FIG. 4B, the lift-off resist is removed, leaving the protection layer 162 encapsulating the dielectric coating 140. At this stage, a non-buffered HF acid release process can be performed to remove the portion of the sacrificial layer underneath the membrane 156 in the release process.

The protection layer 162 is stripped after release using, for example, a wet etch step.

Figure 5A:
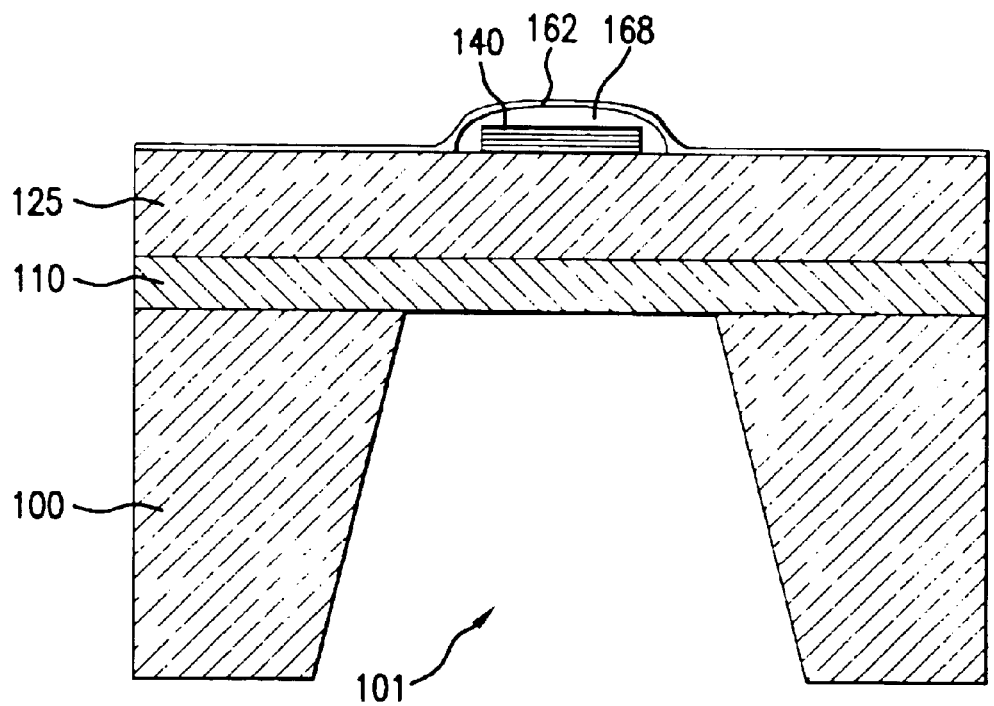
FIGS. 5A through 5C are schematic cross-sectional views illustrating still another embodiment of a MEMS membrane fabrication sequence according to the present invention.
Figure 5B:
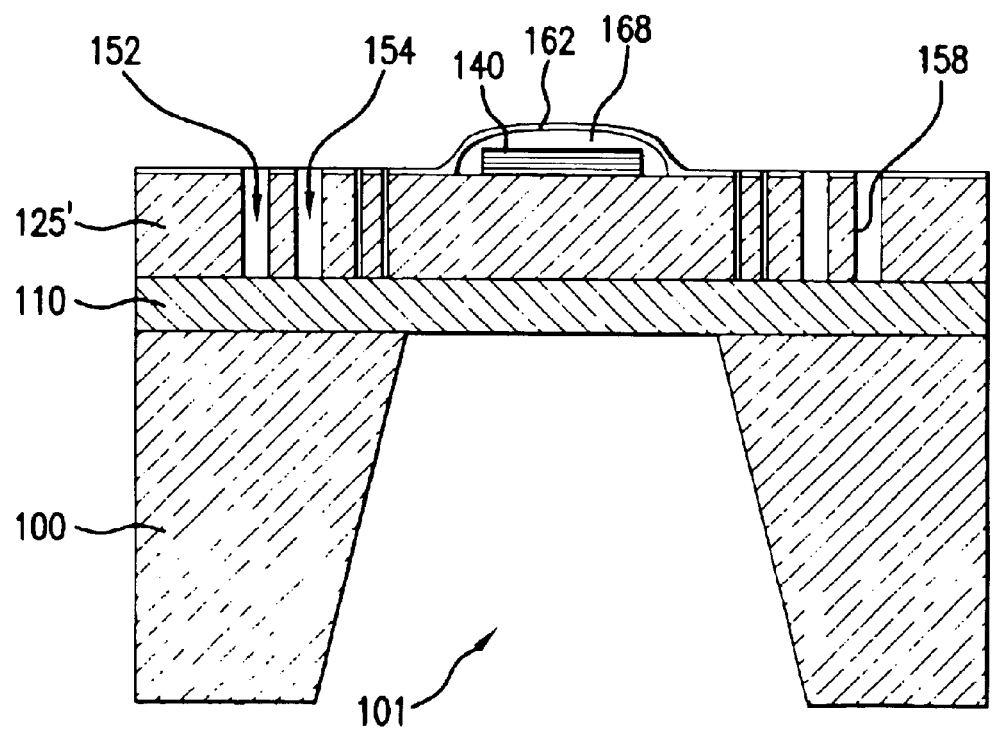
Figure 5C:
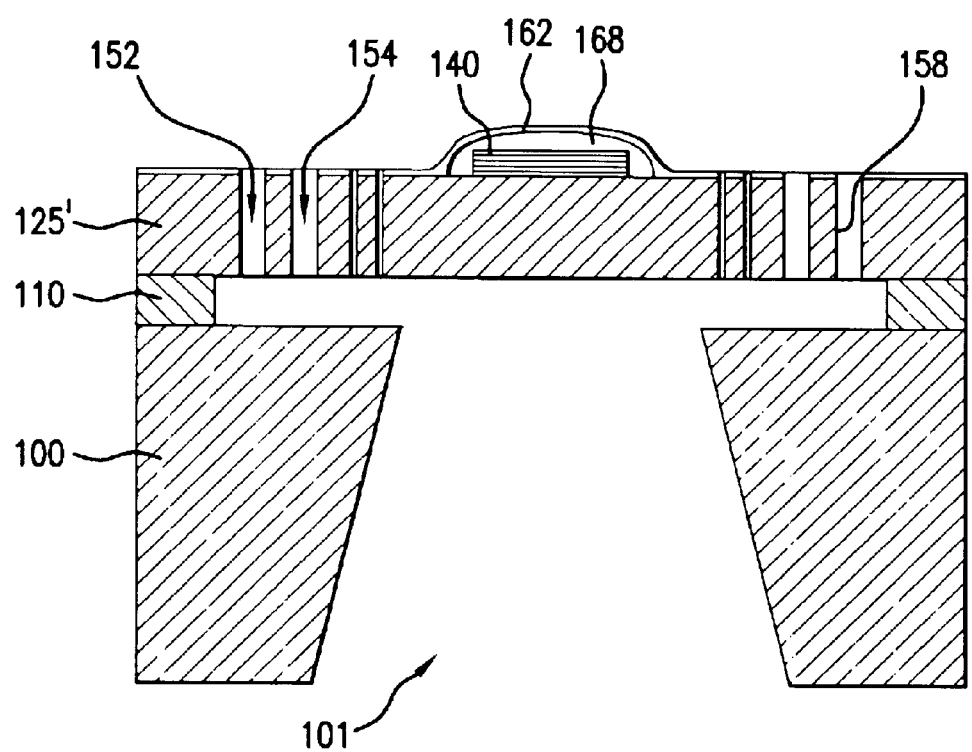

FIGS. 5A–5B show another process flow. In this case, a first smoothing layer 168, such as a resist, is used to cover and smooth the sensitive topography of the dielectric coating 140 and also provide an ancillary barrier to the HF acid or other release etchant. Next, a membrane mask/patterned dielectric protection layer 162 is applied that is both impervious to the release acid and is also a good masking material for the membrane topography. A metal, such as gold or nickel, is used in one implementation. The protection masking layer 162 is then patterned with the membrane pattern as illustrated in FIG. 5B. The pattern is transferred to yield the patterned membrane layer 125'. Next, as illustrated in FIG. 5C, the release process is performed with the protection layer 162 preserving the coating 140, after which the masking protection layer 162 and the photoresist layer 168 are removed.

Figure 6A:
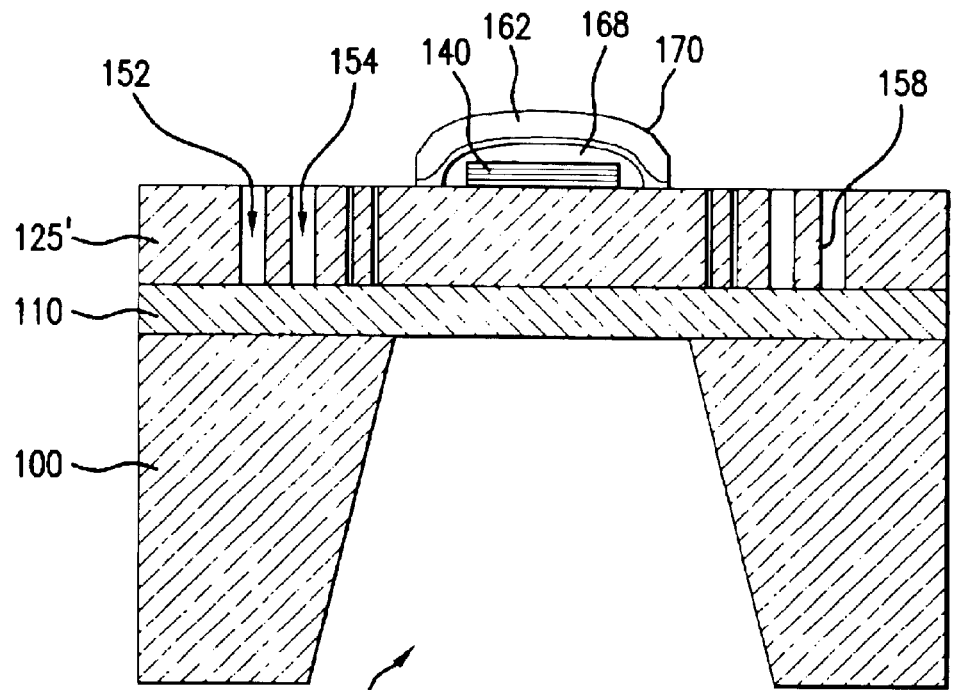
FIGS. 6A and 6B are schematic cross-sectional views illustrating a fourth embodiment of a MEMS membrane fabrication sequence according to the present invention.
Figure 6B:
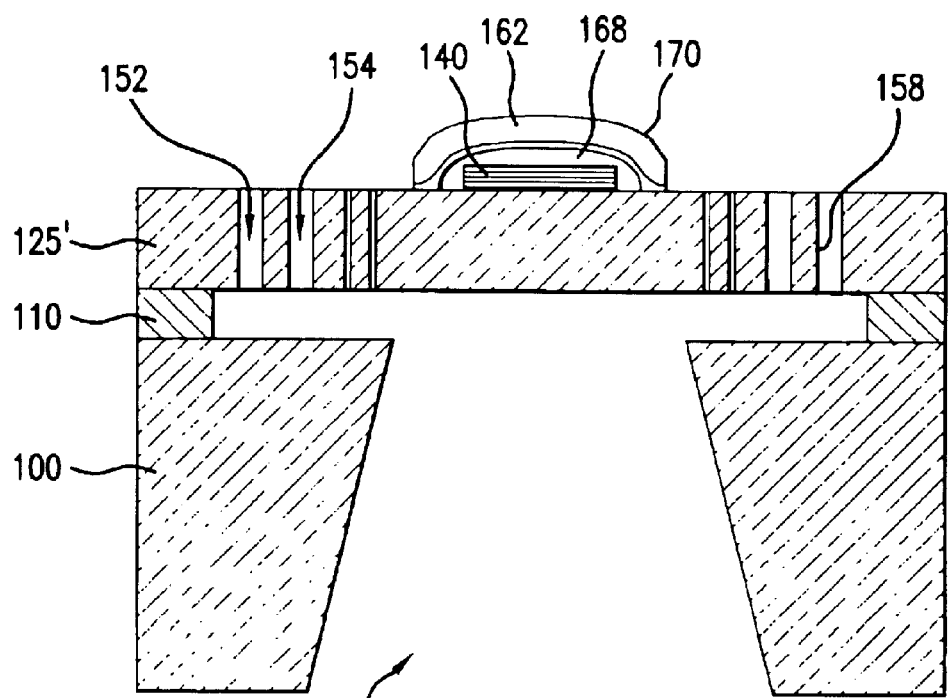

FIGS. 6A and 6B illustrate a modification in which the protection masking layer 162 is etched back prior to membrane release.

Specifically, in FIG. 6A, a protection layer patterning photoresist 170 is deposited and the metal protection layer 162 is removed from the membrane topography, specifically, uncovering the areas where the release etchant must be allowed to reach the sacrificial layer 110.

As illustrated in FIG. 6B, the release process is performed.

Figure 7A:
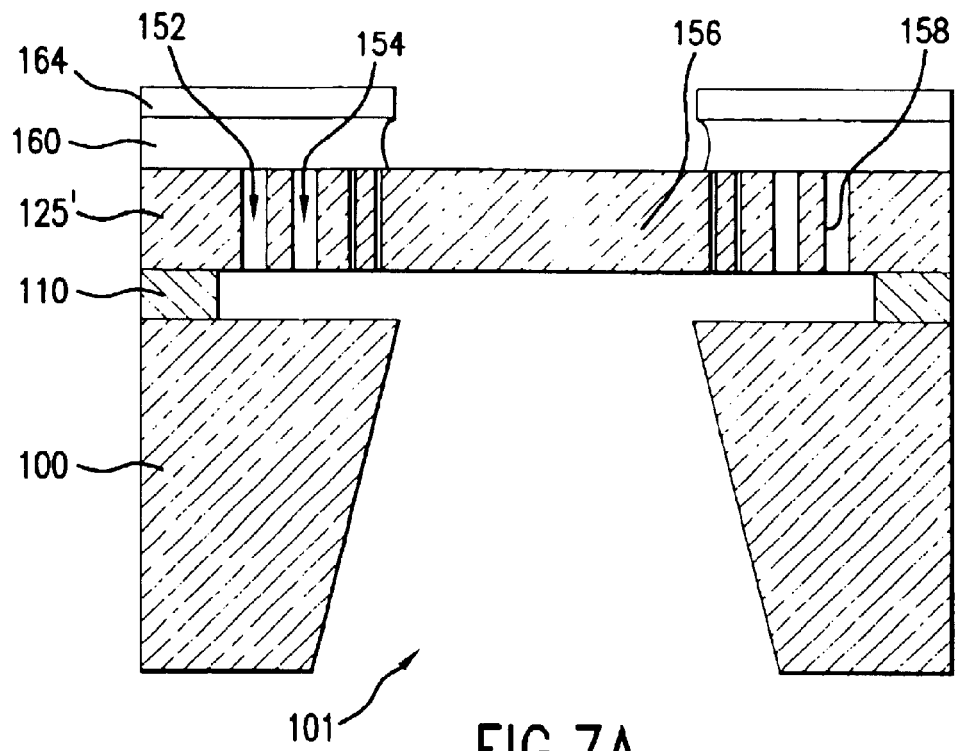
FIGS. 7A and 7B are schematic cross-sectional views illustrating a fifth embodiment of a MEMS membrane fabrication sequence according to the present invention.
Figure 7B:
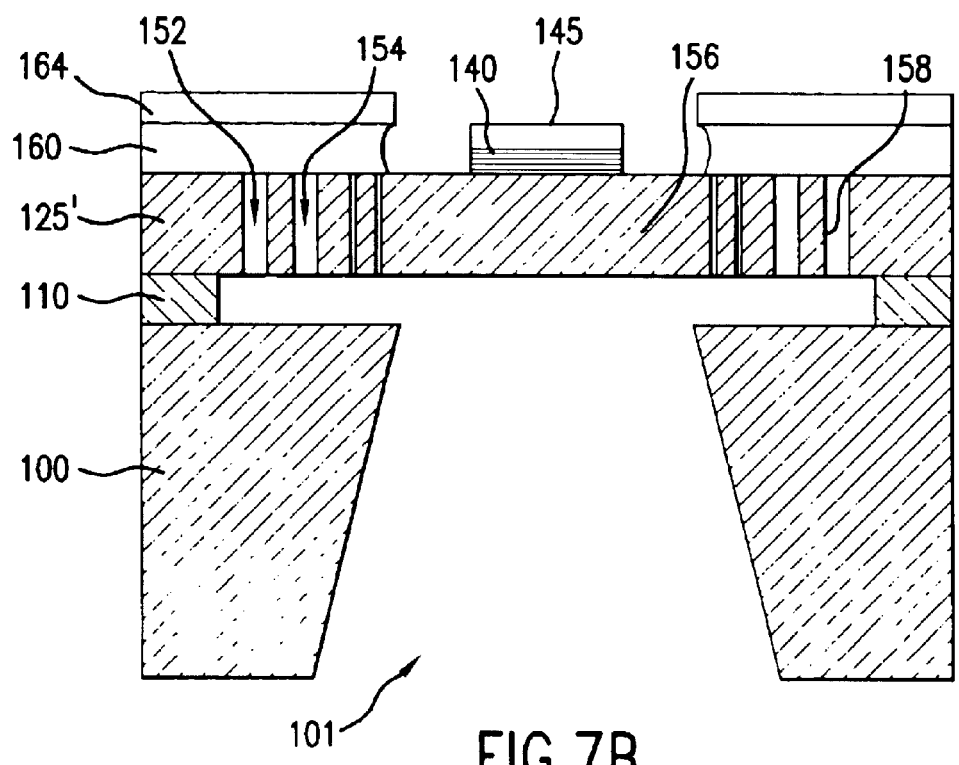

FIGS. 7A and 7B illustrate a process flow in which the release of the MEMS structure is partially or completely performed prior to the deposition and patterning of the dielectric coating.

Specifically, in FIG. 7A, a membrane topography protection layer 160 is deposited outside of the optical port region of a released or partially released membrane structure 156. For this, a thick lift-off resist is preferably used. The voids or regions 152, 154 and the etchant holes 232 are covered. A second photoresist layer 164 can be applied and patterned.

Next as illustrated in FIG. 7B, the dielectric coating 140 is deposited over the front side followed by a resist mask layer 145 that is patterned to reside in the optical port region. The exposed dielectric coating 140 is then etched back to form the illustrated structure. The resist mask 145 is then removed.

If required, a final complete release of the membrane is performed. This process, however, is much shorter due to the prior partial release step.

Figure 8:
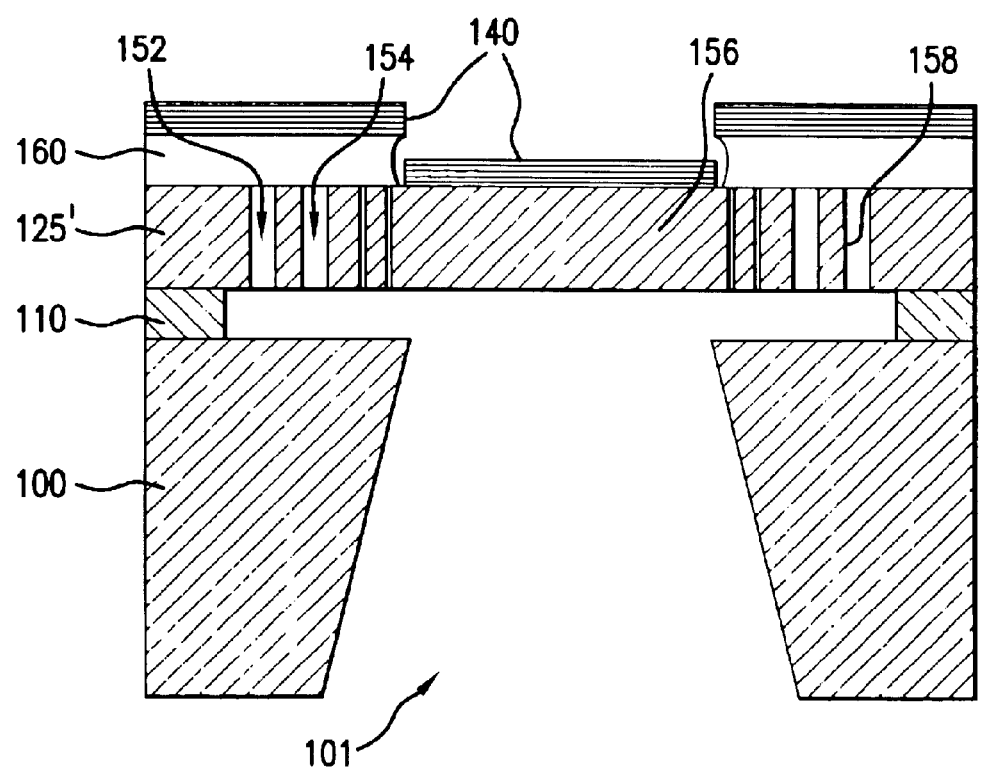
FIG. 8 is schematic cross-sectional view illustrating a sixth embodiment of a MEMS membrane fabrication sequence according to the present invention.

FIG. 8 illustrates still another option in which the lift-off resist topography protection layer 160 is used to as a mask to pattern the dielectric coating 140. Specifically, the dielectric coating is deposited into optical port region and on top of the lift-off resist 160. The excess dielectric is removed with resist 160.

A difficulty with these embodiments is resist survival in the elevated temperatures required in the dielectric coating process.

While this invention has been particularly shown and described with references to preferred embodiments thereof, it will be understood by those skilled in the art that various changes in form and details may be made therein without departing from the scope of the invention encompassed by the appended claims. For example, in the particular process flows shown, the optical port is patterned into the backside of the wafer prior to the deposition of the dielectric film on the front side, in some cases. Executing this step prior to depositing the optical coatings is not necessary. For example, the dielectric could be applied to a plain SOI wafer and patterned prior to etching the optical port. The protection methods would be essentially unchanged. For other devices, the point at which the dielectric film is patterned could be adjusted to optimize the overall process flow.

What is claimed is:

1. A process for fabricating a deflectable optical MEMS structure having a dielectric coating, the process comprising:
   forming a device layer;
   depositing a multilayer reflective dielectric optical coating over the device layer;
   depositing a mask layer over the device layer;
   patterning the mask layer;
   transferring a pattern of the mask layer into the dielectric coating; and
   removing at least part of a sacrificial layer to release the device layer and form a membrane; and installing the membrane opposite a stationary reflector to form a tunable Fabry-Perot filter.

2. A process as claimed in claim 1, wherein the step of removing the sacrificial layer is performed after the patterning of the dielectric coating.

3. A process as claimed in claim 1, wherein the step of removing the sacrificial layer is performed, at least in part, before the patterning of the dielectric coating.

4. A process as claimed in claim 1, wherein the step of forming the device layer comprises depositing the device layer on the sacrificial layer.

5. A process as claimed in claim 1, wherein the step of forming the device layer comprises bonding the device lever to the sacrificial lever.

6. A process as claimed in claim 1, wherein the step of depositing the mask layer comprises depositing a photoresist material.

7. A process as claimed in claim 1, wherein the step of depositing the mask layer comprises depositing a metal layer.

8. A process as claimed in claim 1, wherein the step of patterning the mask layer comprises removing a portion mask layer in an optical port region.

9. A process as claimed in claim 1, wherein the step of patterning the mask layer comprises removing portions of the mask layer outside of the an optical port region.

10. A process as claimed in claim 1, wherein the step of transferring the pattern of the mask layer into the dielectric coating comprises etching portions of the dielectric coating exposed by the mask layer.

11. A process as claimed in claim 1, further comprising patterning tethers into the device layer.

12. A process as claimed in claim 1, wherein the step of removing at least part of the sacrificial layer is performed after the step of depositing the dielectric optical coating; the process further comprising covering the dielectric optical coating with a protecting layer during removal of the sacrificial layer.

13. A process as claimed in claim 1, wherein the step of depositing the multilayer reflective dielectric optical coating over the device layer comprises depositing successive quarterwave dielectric coatings.

14. A process for fabricating a deflectable optical MEMS structure having a dielectric coating, the process comprising:
    forming a device layer;
    depositing a multilayer reflective dielectric optical coating over the device layer;
    depositing a mask layer over the device layer;
    patterning the mask layer;
    transferring a pattern of the mask layer into the dielectric coating; and
    removing at least part of a sacrificial layer to release the device layer; and
    wherein the step of transferring the pattern of the mask layer into the dielectric coating comprises removing the mask layer and portions of the dielectric coating on the mask layer.

15. A process as claimed in claim 14, further comprising installing the membrane at one end of a laser cavity.

16. A process as claimed in claim 14, farther comprising installing the membrane opposite a stationary reflector to form a tunable Fabry-Perot filter.

17. A process as claimed in claim 14, wherein the multilayer reflective dielectric optical coating functions as a dichroic filter.

18. A process for fabricating a mirror of a tunable Fabry-Perot filter, the process comprising:
    depositing a multilayer reflective dielectric optical coating;
    depositing a mask layer;
    patterning the mask layer;
    transferring a pattern of the mask layer into the dielectric coating to thereby form the mirror of the tunable Fabry-Perot filter.

19. A process as claimed in claim 18, wherein the step of depositing the mask layer comprises depositing a photoresist material.

20. A process as claimed in claim 18, wherein the step of depositing the mask layer comprises depositing a metal layer.

21. A process as claimed in claim 18, wherein the step of patterning the mask layer comprises removing a portion mask layer in a region of an optical axis.

22. A process as claimed in claim 18, wherein the step of patterning the mask layer comprises removing portions of the mask layer outside a region of an optical axis.

23. A process as claimed in claim 18, wherein the step of transferring the pattern of the mask layer into the dielectric coating comprises removing the mask layer and portions of the dielectric coating on the mask layer.

24. A process as claimed in claim 18, wherein the step of transferring the pattern of the mask layer into the dielectric coating comprises etching portions of the dielectric coating exposed by the mask layer.

25. A process as claimed in claim 18, wherein the step of depositing the multilayer reflective dielectric optical coating over the device layer comprises depositing successive quarterwave dielectric coatings.

26. A process as claimed in claim 18, wherein the multilayer reflective dielectric optical coating functions as a dielectric filter.

* * * * *